(12) United States Patent
Chang et al.

(10) Patent No.: US 9,735,058 B2
(45) Date of Patent: *Aug. 15, 2017

(54) METHOD OF FORMING PERFORMANCE OPTIMIZED GATE STRUCTURES BY SILICIDIZING LOWERED SOURCE AND DRAIN REGIONS

(71) Applicant: INTERNATIONAL BUSINESS MACHINES CORPORATION, Armonk, NY (US)

(72) Inventors: Paul Chang, Mahopac, NY (US); Katsunori Onishi, Somers, NY (US); Jian Yu, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/211,742

(22) Filed: Jul. 15, 2016

(65) Prior Publication Data

US 2016/0322258 A1 Nov. 3, 2016

Related U.S. Application Data

(63) Continuation of application No. 14/561,550, filed on Dec. 5, 2014, now Pat. No. 9,455,195.

(51) Int. Cl.
*H01L 21/8234* (2006.01)
*H01L 29/66* (2006.01)
(Continued)

(52) U.S. Cl.
CPC ......... *H01L 21/823418* (2013.01); *H01L 21/02362* (2013.01); *H01L 21/3081* (2013.01);
(Continued)

(58) Field of Classification Search
CPC ....... H01L 21/823418; H01L 21/02362; H01L 21/823814; H01L 21/3081
See application file for complete search history.

(56) References Cited

U.S. PATENT DOCUMENTS 6,621,131 B2  9/2003  Murthy et al.
6,888,176 B1  5/2005  Horch et al.
(Continued)

OTHER PUBLICATIONS

"List of IBM Patents or Patent Applications Treated as Related" 1 page.
(Continued)

*Primary Examiner* — Michael Jung
(74) *Attorney, Agent, or Firm* — Steven J. Meyers; Andrew M. Calderon; Roberts Mlotkowski Safran Cole & Calderon, P.C.

(57) ABSTRACT

A performance optimized CMOS FET structure and methods of manufacture are disclosed. The method includes forming source and drain regions for a first type device and a second type device. The method further includes lowering the source and drain regions for the first type device, while protecting the source and drain regions for the second type device. The method further includes performing silicide processes to form silicide regions on the lowered source and drain regions for the first type device and the source and drain regions for the second type device.

8 Claims, 4 Drawing Sheets

(51) Int. Cl.
*H01L 29/45* (2006.01)
*H01L 29/417* (2006.01)
*H01L 27/088* (2006.01)
*H01L 21/8238* (2006.01)
*H01L 29/08* (2006.01)
*H01L 29/16* (2006.01)
*H01L 29/161* (2006.01)
*H01L 29/165* (2006.01)
*H01L 29/78* (2006.01)
*H01L 21/02* (2006.01)
*H01L 21/308* (2006.01)

(52) U.S. Cl.
CPC .... *H01L 21/823814* (2013.01); *H01L 27/088* (2013.01); *H01L 29/0847* (2013.01); *H01L 29/161* (2013.01); *H01L 29/165* (2013.01); *H01L 29/1608* (2013.01); *H01L 29/41783* (2013.01); *H01L 29/45* (2013.01); *H01L 29/665* (2013.01); *H01L 29/66636* (2013.01); *H01L 29/7848* (2013.01); *H01L 29/7851* (2013.01)

(56) References Cited

U.S. PATENT DOCUMENTS

| | | | |
|---|---|---|---|
| 7,075,161 | B2 | 7/2006 | Barth |
| 7,358,551 | B2 | 4/2008 | Chidambarrao et al. |
| 8,324,699 | B2 | 12/2012 | Ichijo et al. |
| 2005/0280098 | A1 | 12/2005 | Shin et al. |
| 2006/0255415 | A1 | 11/2006 | Freeman et al. |
| 2008/0142838 | A1 | 6/2008 | Ohta et al. |
| 2008/0157218 | A1 | 7/2008 | Ahn |
| 2009/0236633 | A1* | 9/2009 | Chuang .................. H01L 27/11 257/190 |
| 2009/0267119 | A1 | 10/2009 | Tamura |
| 2010/0197092 | A1* | 8/2010 | Kim ................. H01L 21/823807 438/229 |
| 2010/0210083 | A1 | 8/2010 | Fukuda et al. |
| 2010/0224936 | A1 | 9/2010 | Hokazono |
| 2011/0121315 | A1 | 5/2011 | Ohta et al. |
| 2011/0291197 | A1 | 12/2011 | Wu et al. |
| 2012/0032275 | A1* | 2/2012 | Haran ................ H01L 21/28518 257/401 |
| 2012/0080759 | A1 | 4/2012 | Ema et al. |
| 2012/0153398 | A1 | 6/2012 | Baars et al. |
| 2013/0049126 | A1 | 2/2013 | Flachowsky et al. |
| 2013/0285153 | A1 | 10/2013 | Lee et al. |
| 2014/0001561 | A1* | 1/2014 | Cheng ............. H01L 21/823807 257/369 |
| 2014/0117380 | A1 | 5/2014 | Loboda et al. |
| 2014/0239404 | A1 | 8/2014 | Huang et al. |
| 2014/0306250 | A1 | 10/2014 | Gardner et al. |
| 2016/0163599 | A1 | 6/2016 | Chang et al. |

OTHER PUBLICATIONS

Specification "Performance Optimized Gate Structures" and Drawings for related U.S. Appl. No. 15/070,154, filed Mar. 15, 2016, 19 pages.
Final Office Action in the related U.S. Appl. No. 15/070,154 dated Sep. 29, 2016, 25 pages.
Office Action from U.S. Appl. No. 15/070,154 dated Jan. 27, 2017. 10 pages.
otice of Allowance from U.S. Patent Application No. 15/070,154 dated May 9, 2017; 8 pp.

* cited by examiner

METHOD OF FORMING PERFORMANCE OPTIMIZED GATE STRUCTURES BY SILICIDIZING LOWERED SOURCE AND DRAIN REGIONS

FIELD OF THE INVENTION

The invention relates to semiconductor structures and, more particularly, to performance optimized CMOST FET structures and methods of manufacture.

BACKGROUND

As transistor dimensions are scaled, spacers used to place silicide away from the source-drain to body junction have likewise reduced in dimension. To prevent junction leakages associated with silicide encroachment, epitaxial overfill in the S-D has been utilized to increase silicide proximity away from the junction. The structural and selectivity requirements for this overfill can result in material and electrical properties that can negatively impact device performance.

Also, different devices with varying requirements for leakage and performance can require different levels of S-D overfill. However epitaxial S-D formation is also a very complex and costly process, and hence it is desirable to minimize the variations of epitaxial growth included in a process.

SUMMARY

In an aspect of the invention, a method comprises forming source and drain regions for a first type device and a second type device. The method further comprises lowering the source and drain regions for the first type device, while protecting the source and drain regions for the second type device. The method further comprises performing silicide processes to form silicide regions on the lowered source and drain regions for the first type device and the source and drain regions for the second type device.

In an aspect of the invention, a method comprises: forming first type devices and second type devices on a substrate; epitaxially growing source and drain regions within source/drain cavities provided adjacent to the first type devices and the second type devices; etching back the source and drain regions for the first type devices to be in closer proximity to a channel region of the first type devices, while protecting the source and drain regions for the second type devices; and forming silicide regions on the etched back source and drain regions for the first type devices and the source and drain regions for the second type devices. The silicide regions for the first type devices are in closer proximity to the channel region than the silicide regions for the second type devices.

In an aspect of the invention, a structure comprises: at least one leakage sensitive device with silicided raised source and drain regions in proximity to a channel region of the at least one leakage sensitive device; and at least one performance sensitive device with silicided source and drain regions that are in closer proximity to a channel region of the at least one performance sensitive device than the silicided raised source and drain regions are to the channel region of the at least one leakage sensitive device.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to performance optimized gate structures and methods of manufacture. More specifically, the performance optimized gate structures are field effect transistors (FETs) for memory devices or logic devices, as an example. Advantageously, the FET structures can be optimized by minimizing silicide encroachment for low leakage devices, e.g. memory devices, while optimizing the performance and resistance for performance sensitive devices, e.g., logic devices. That is, by implementing the processes herein, devices can be tailored to have varying silicide to channel proximity, e.g., performance sensitive devices can have closer silicide to channel proximity than more leakage sensitive devices.

Advantageously, the invention provides an alternative process for varying levels of S-D overfill, with reduced cost and complexity. In embodiments, the epitaxial S-D overfill can be optimized by incorporating an etch back process on selected source/drain epitaxial grown material, followed by a silicide process. For example, downstream etch processes can be utilized to etch back the epitaxial overfill of S-D regions on selective device types, allowing for optimization between devices with different junction leakage and performance requirements. The differential etching processes deployed by the fabrication processes described herein can coincide with existing differential gate hard-mask removal steps, requiring no additional masks to optimize between high performance logic devices and low junction leakage memory devices, as examples.

The structures described herein can be manufactured in a number of ways using a number of different tools. In general, though, the methodologies and tools are used to form structures with dimensions in the micrometer and nanometer scale. The methodologies, i.e., technologies, employed to manufacture the structures described herein have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
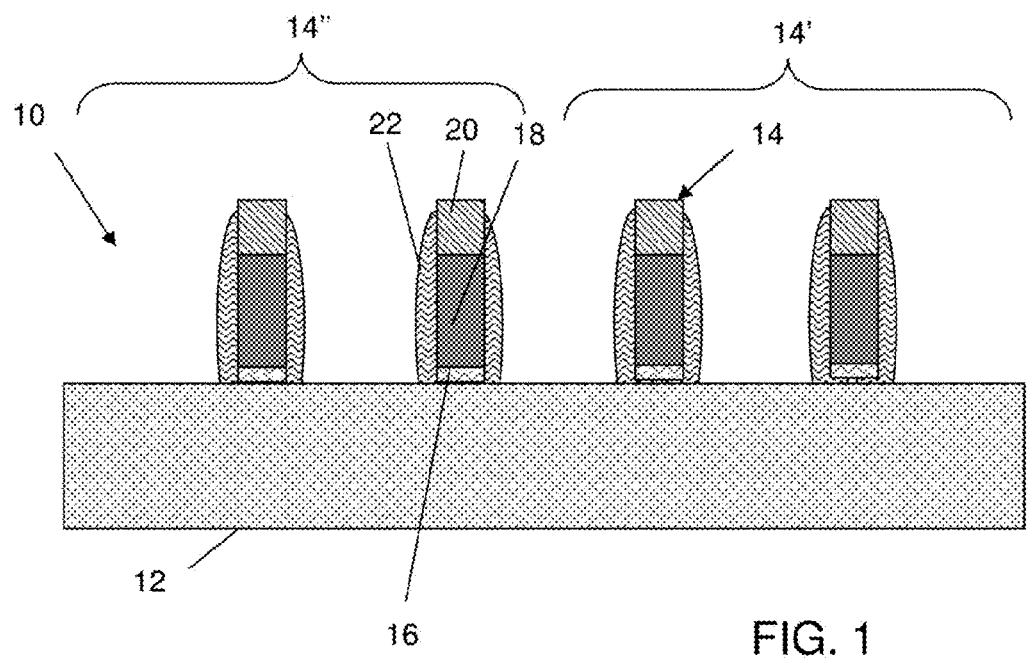
FIG. 1 shows a structure and respective fabrication processes of forming gate structures on a substrate according to aspects of the invention.

FIG. 1 shows a starting structure and respective processing steps in accordance with aspects of the present invention. The structure 10 includes a substrate 12 with a plurality of devices 14. In embodiments, the substrate 12 can be any semiconductor material including, but not limited to, Si, SiGe, SiGeC, SiC, GE alloys, GaAs, InAs, InP, and other III/V or II/VI compound semiconductors. The devices 14 can be lower leakage devices 14' and higher leakage, higher performance devices 14". In embodiments, the devices 14 can be memory devices 14' and logic devices 14", for example. It should be understood by those of ordinary skill in the art that memory devices 14' are more leakage sensitive, compared to the logic devices 14" which are more performance sensitive and which may benefit from silicide contacts being in closer proximity to a channel region.

In embodiments, the devices 14 include gate structures comprising a dielectric material 16, a gate material 18, a cap layer 20 and sidewall structures 22. In embodiments, the dielectric material 16 can be a high-k dielectric material such as hafnium oxide (HfO$_2$); although other dielectric materials are contemplated herein, e.g., oxide based dielectrics. The gate material 18 can be a poly material or other gate metal depending on the performance criteria of the device. The cap layer 20 and the sidewall structures 22 can be a nitride or oxide based material. In embodiments, the cap layer 20 and the sidewall structures 22 can be formed from the same material or different materials, depending on downstream etch processes and/or other design criteria. In the example of using the same materials, the cap layer 20 would preferably be a thicker layer than the sidewall structures 22.

In embodiments, the devices 14 can be formed using conventional deposition, lithography and etching processes. By way of example, the layers of material 16, 18 and 20 described above can be deposited using conventional deposition processes. The conventional deposition processes can include, amongst others, a chemical vapor deposition (CVD) process, a plasma deposition (PVD) process or an atomic layer deposition (ALD) process. To pattern the structures, a resist is formed on the cap layer 20, which is then exposed to energy (light) to form a pattern (openings). An etching process (e.g., reactive ion etching process with selective chemistries to each of the layers of material 16, 18 and 20) is then performed through the opening(s) to pattern the gate structures. The resist can be removed using conventional stripants or etchants, e.g., oxygen ashing processes.

Still referring to FIG. 1, the sidewall structures 22 are then formed using a deposition process of sidewall material, e.g., nitride or oxide, followed by an anisotropic etching process. The anisotropic etching process removes any material on horizontal surfaces of the structure, e.g., on exposed surfaces of the cap layer 20 and the substrate 12, leaving behind the sidewall structures 22.

Figure 2:
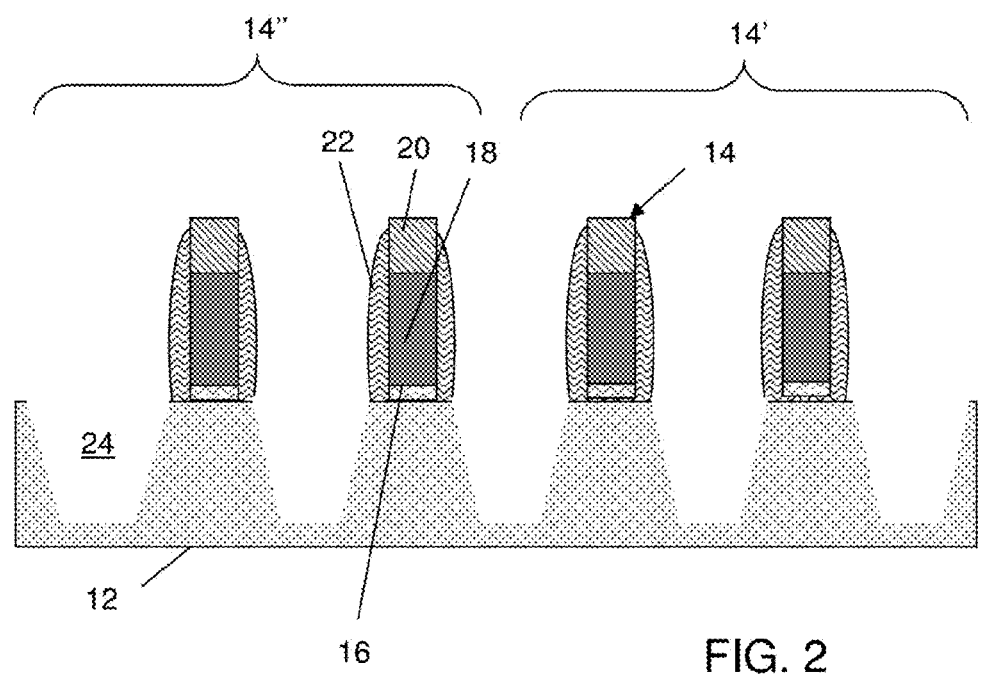
FIG. 2 shows a structure and respective fabrication processes of forming a source/drain cavity according to aspects of the invention.

In FIG. 2, a source/drain cavity 24 is formed within the substrate using conventional lithography and etching processes. For example, a resist is formed over the devices 14 and exposed portions of the substrate 12, and subsequently exposed to energy (light) to form a pattern (openings) coinciding with spaces between adjacent devices 14', 14". An etching process (e.g., reactive ion etching process with selective chemistry to the substrate 12) is performed through the openings to form the source/drain cavities 24. The resist can then be removed using conventional stripants or etchants, e.g., oxygen ashing processes.

Figure 3:
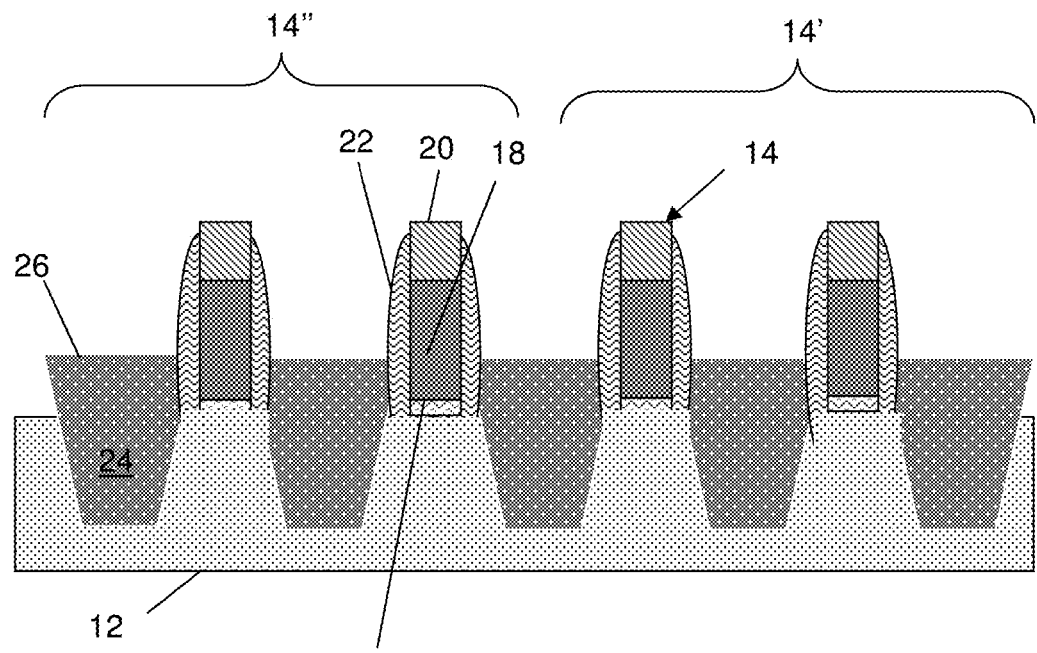
FIG. 3 shows a structure and respective fabrication processes of forming source and drain regions in the source/drain cavity according to aspects of the invention.

Referring to FIG. 3, source and drain regions 26 are formed in the respective source/drain cavities 24 for both device types 14', 14". In embodiments, the source and drain regions 26 are formed in a same process step for both device types 14', 14". More specifically, the source and drain regions 26 are raised, formed by an epitaxial growth process. In embodiments, the epitaxial growth process can be any semiconductor material that grows on the substrate 12. The raised source and drain regions 26 can be formed to a height of about 10-25 nm above a surface of the substrate 12, although other dimensions are also contemplated herein depending on the particular technology node and required device performance characteristics.

The raised source and drain regions 26 can be doped material or ion implanted after the growth process to form the source and drain of the devices 14', 14". In embodiments, the source and drain regions 26 will have either N-type dopants or P-type dopants, depending on the type of device. For example and by way of non-limiting illustration, N-type dopants can include arsenic or phosphorous; whereas, P-type dopants can be boron (although other N-type dopants and P-type dopants are contemplated by the present invention).

Figure 4:
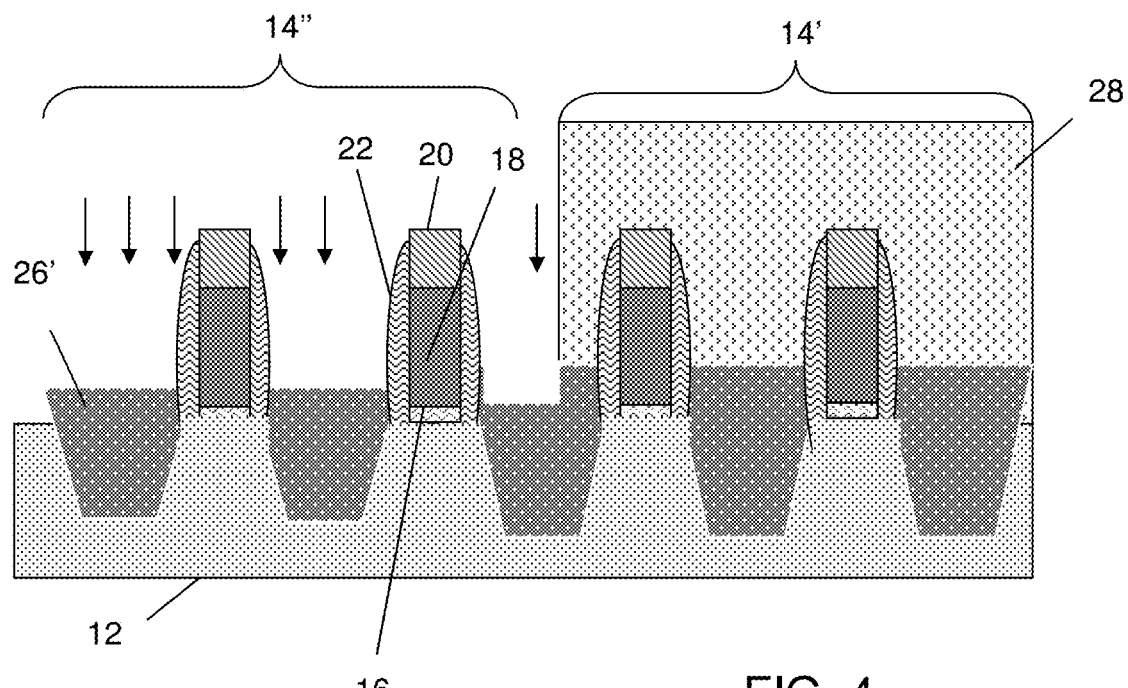
FIG. 4 shows a structure and respective fabrication processes of selectively recessing the source and drain regions according to aspects of the invention.

In FIG. 4, the source and drain regions 26' are recessed or lowered according to aspects of the invention. More specifically, the source and drain regions 26' associated with the performance sensitive devices 14", are recessed or lowered using a selective etch back recess process. The lowering of the source and drain regions 26' will bring them in closer proximity to a channel region of the devices 14". The selective etch back recess process can be a RIE process selective to silicon or other semiconductor material, depending on the material of the source and drain regions 26'. During this selective etch back recess process, the raised source and drain regions 26 associated with the leakage sensitive devices 14', remain protected by a mask 28.

Figure 5:
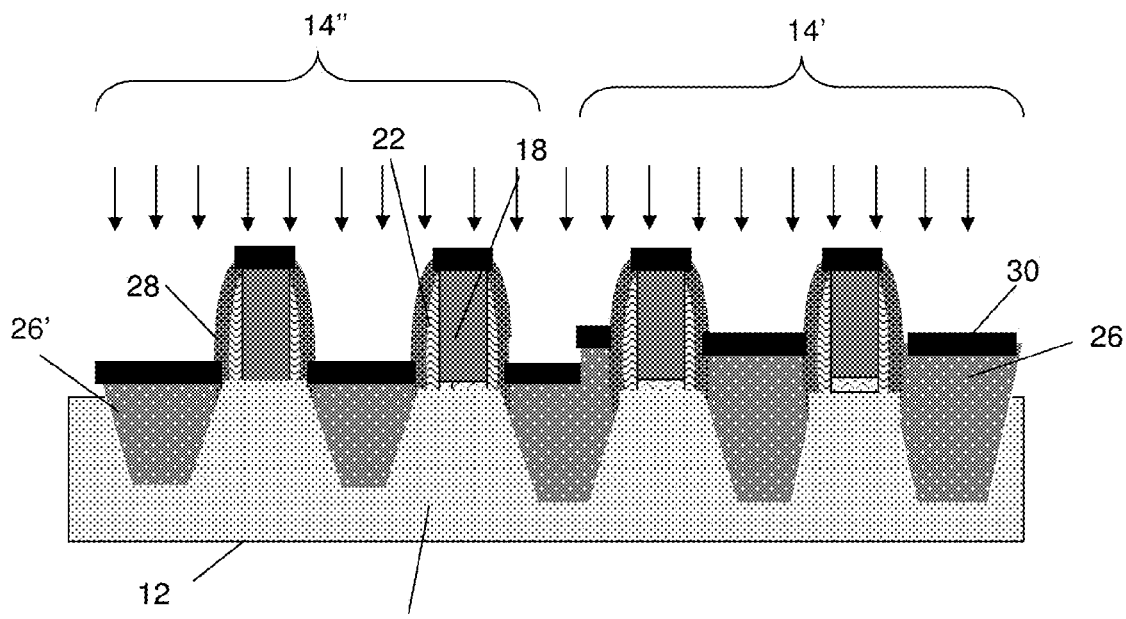
FIG. 5 shows a structure and respective fabrication processes including forming a silicide spacer and silicide on the source and drain regions and gate structure according to aspects of the invention.

FIG. 5 shows a structure and respective fabrication processes including forming silicide on the source and drain regions 26, 26' and on the devices 14', 14" according to aspects of the invention. Prior to the silicide formation, the cap layer is removed from a top surface of the devices 14', 14" by a selective etching process. This selective etching process can be a maskless process using an etch chemistry selective to the cap material, e.g., nitride or oxide. In this embodiment, the cap layer should be a different material than the sidewall structures 28; although the same material can be used in which case the cap layer will be thicker. It should also be noted that the removal of the cap layer is a flexible process and can be removed prior to the recessing of the S/D regions.

Prior to or after removal of the cap layer, a sidewall 28 can be formed on the sidewall structures 22. The sidewalls 28 would be formed in similar processes as described with regard to the formation of the sidewall structures 22. In embodiments, the sidewalls 28 can act as a mask to protect the sidewall structures 22 and the devices 14', 14" during the removal of the cap layer, as an illustrative example.

FIG. 5 further shows forming silicide regions 30 on the source and drain regions 26, 26' and the respective devices 14', 14" according to aspects of the invention. In embodiments, silicide regions 30 on the source and drain regions 26, 26' and the top surfaces of the respective devices 14', 14", e.g., on material 18, can be formed by a nickel silicide process; although cobalt and titanium silicide processes are also contemplated herein. By implementing the processes herein, the devices 14' and 14" can be tailored to have varying silicide to channel proximity, as the heights of the source and drain regions 26, 26' are now adjusted based on leakage and performance criteria. That is, as in embodiments described herein, performance sensitive devices 14' can have closer silicide to channel proximity than leakage sensitive devices 14".

As should be understood by those of skill in the art, the silicide process begins with deposition of a thin transition metal layer, e.g., nickel, cobalt or titanium, over fully formed and patterned semiconductor devices (e.g., doped or ion implanted source and drain regions 26, 26' and respective devices 14', 14"). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 30 in the active regions of the device. It should be understood by those of skill in the art that silicide contacts will not be required on the devices, when a gate structure is composed of a metal material.

Figure 6:
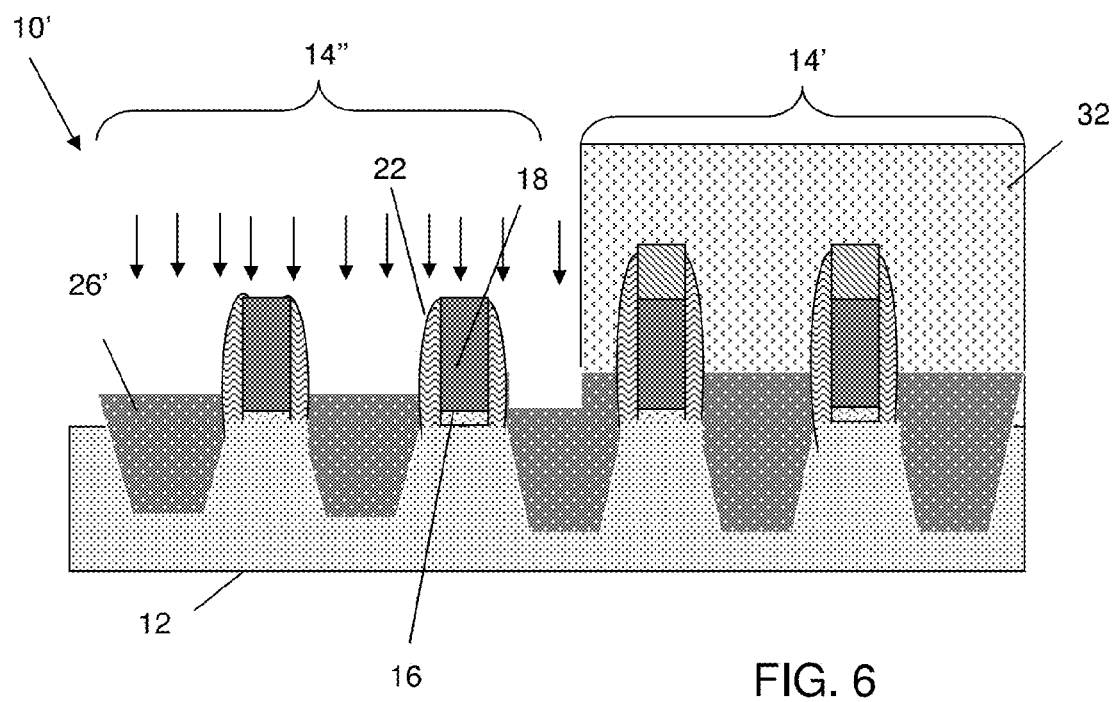
FIG. 6 shows an alternate structure and respective fabrication processes of removing a cap layer on the gate structure and recessing the source and drain regions according to aspects of the invention.

FIG. 6 shows an alternate structure and respective fabrication processes of removing a cap layer on the gate structure and recessing the source and drain regions according to aspects of the invention. In this alternative structure 10', the cap layer can be removed and the source and drain regions 26' can be recessed (lowered) with a single masking step on the side of the device 14", using mask 32, to be in closer proximity to the channel region. More specifically, the mask 32 formed over the devices 14' is patterned to form an opening exposing the devices 14" and respective structures. A first etching step is performed to remove the cap layer, followed by a second etching step to recess or lower the source and drain regions 26'. In embodiments, the etching process for removal of the cap layer will be an anisotropic etch process with a selective chemistry to the cap layer material. In this process, though, the source and drain regions 26' can also be slightly recessed. Thereafter, the source and drain regions 26' are etched back as already described herein. The mask can be removed using a conventional stripping process.

Figure 7:
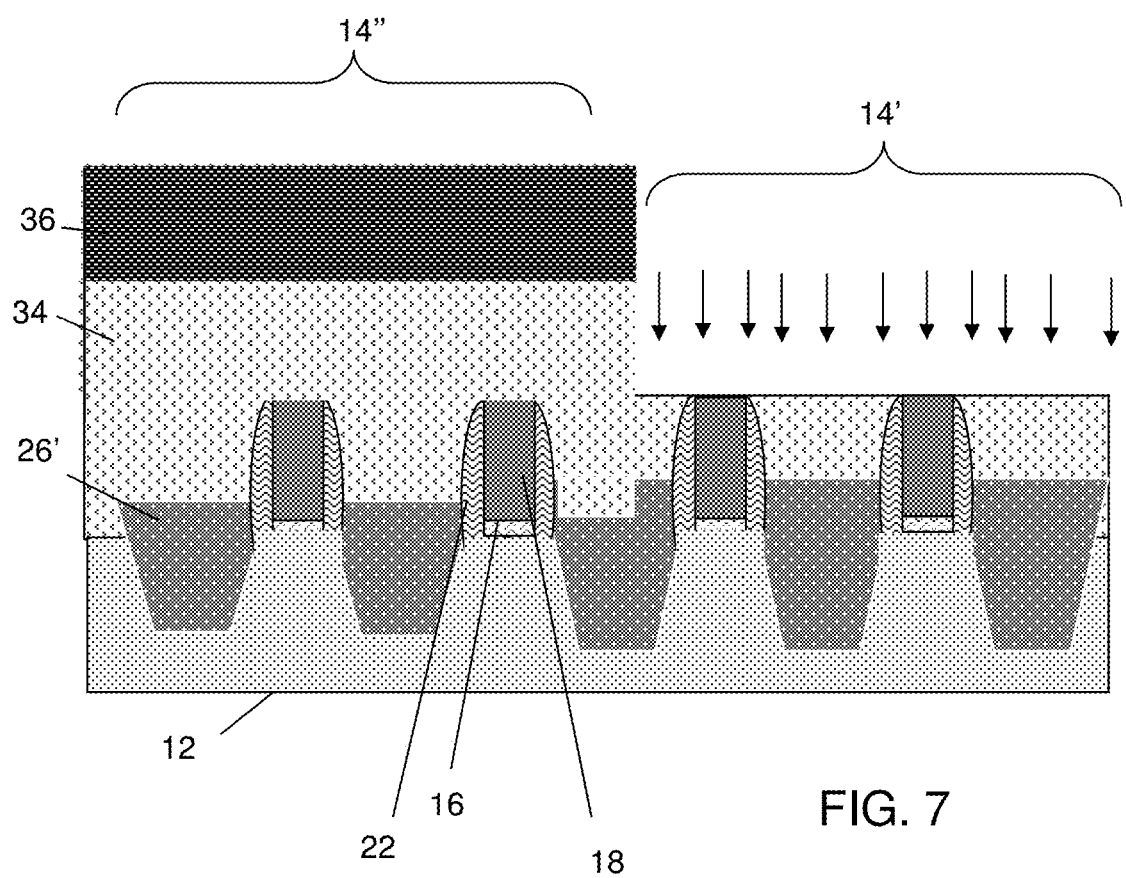
FIG. 7 shows the structure of FIG. 6 undergoing fabrication processes including removal of a cap layer on gate structures according to aspects of the invention.

In FIG. 7, the cap layer on devices 14' can be removed according to aspects of the invention. More specifically, a first masking layer 34 is formed over the devices 14', 14", followed by a second masking layer 36. In embodiments, the first mask 34 can be an organic planarization layer (OPL) mask which has a same or substantially similar etch rate as the cap layer. The second mask 36 is patterned to form an opening corresponding to an area above the devices 14' and to expose the first mask 34. The first mask 34 is then etched back until the etchant strips or removes the cap layer on the devices 14'; that is, the first mask 34 is etched back until it reaches the cap layer with the etching continuing until the cap layer on the devices 14' is removed. The first mask 34 and the second mask 36 will protect the devices 14" and respective source and drain regions 26'; whereas, the first mask 34 will protect the source and drain regions 26 associated with the devices 14' (so that they do not recess). More specifically, etching will discontinue after the removal of the cap layer such that the first mask 34 will remain over the source and drain regions 26 associated with the devices 14'. For this reason, the source and drain regions 26 associated with the devices 14' should be lower than the cap layer on the devices 14'.

In this way, it is now possible through the processes described herein to selectively alter the heights of the source and drain regions 26, 26' and hence vary silicide to channel proximity. Following the mask strip, the processes will continue with those described with respect to FIG. 5, e.g., tailored silicide processes.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
   forming first type devices and second type devices on a substrate;
   epitaxially growing source and drain regions within source/drain cavities of the first type devices and epitaxially growing source and drain regions within source/drain cavities of the second type devices;
   etching back the source and drain regions for the first type devices to be in closer proximity to a channel region of the first type devices, while protecting the source and drain regions for the second type devices;
   forming silicide regions on the etched back source and drain regions for the first type devices and the source and drain regions for the second type devices; and
   removing a cap layer from the first type devices,
   wherein the silicide regions for the first type devices are in closer proximity to the channel region than the silicide regions for the second type devices, and
   wherein the removing the cap layer from the first type devices and the etching back of the source and drain regions for the first type devices is provided in a single masking process.

2. The method of claim 1, wherein the etching back of the source and drain regions for the first type devices comprises etch back processes with a mask protecting the source and drain regions for second type devices.

3. The method of claim 1, further comprising forming a cap layer on the first type devices to protect the first type devices during the etching back processes of the source and drain regions for the first type devices.

4. The method of claim 1, wherein the source and drain regions for the first type devices and the source and drain regions for the second type devices are doped with either N-type dopants or P-type dopants.

5. The method of claim 1, wherein the single masking process comprises forming a mask over the second type devices and removing the cap layer by an etching process followed by a second etching process to etch back of the source and drain regions so that they are recessed.

6. The method of claim 5, wherein the etching process to remove the cap layer is an by an anisotropic etch process.

7. A method, comprising:
  forming first type devices and second type devices on a substrate;
  epitaxially growing source and drain regions within source/drain cavities of the first type devices and epitaxially growing source and drain regions within source/drain cavities of the second type devices;
  etching back the source and drain regions for the first type devices to be in closer proximity to a channel region of the first type devices, while protecting the source and drain regions for the second type devices;
  forming silicide regions on the etched back source and drain regions for the first type devices and the source and drain regions for the second type devices;
  removing a cap layer from the first type devices and from the second type devices while protecting the first type devices; and
  protecting the source and drain regions for the second type devices while removing the cap layer on the second type devices,
  wherein the silicide regions for the first type devices are in closer proximity to the channel region than the silicide regions for the second type devices.

8. The method of claim 7, wherein the protecting of the source and drain regions for the second type devices comprises:
  forming a first mask over the source and drain regions for the first type devices and the second type devices;
  forming a second mask over the first mask;
  patterning the second mask over areas associated with the second type devices; and
  etching the first mask until it reaches the cap layer on the second type devices and continuing with the etching until the cap layer is removed,
  wherein the first mask has an etch rate that it is the same or substantially the same as the cap layer on the second type devices.

\* \* \* \* \*